United States Patent
Tsair et al.

(10) Patent No.: US 8,928,060 B2
(45) Date of Patent: Jan. 6, 2015

(54) ARCHITECTURE TO IMPROVE CELL SIZE FOR COMPACT ARRAY OF SPLIT GATE FLASH CELL

(71) Applicant: Taiwan Semiconductor Manufacturing Co., Ltd., Hsin-Chu (TW)

(72) Inventors: Yong-Shiuan Tsair, Tainan (TW); Wen-Ting Chu, Kaohsiung (TW); Po-Wei Liu, Tainan (TW); Wen-Tuo Huang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/891,281

(22) Filed: May 10, 2013

(65) Prior Publication Data

US 2014/0264534 A1 Sep. 18, 2014

Related U.S. Application Data

(60) Provisional application No. 61/783,295, filed on Mar. 14, 2013.

(51) Int. Cl.
*H01L 29/788* (2006.01)
*H01L 29/66* (2006.01)

(52) U.S. Cl.
CPC ........ *H01L 29/788* (2013.01); *H01L 29/66825* (2013.01)
USPC .................................. 257/316; 257/E27.075

(58) Field of Classification Search
USPC .................. 257/315, 316, 319, 320, E27.075; 438/587, 593
See application file for complete search history.

(56) References Cited

U.S. PATENT DOCUMENTS

| | | | |
|---|---|---|---|
| 6,291,297 B1 | 9/2001 | Chen | |
| 6,596,586 B1 | 7/2003 | Yang et al. | |
| 6,747,310 B2* | 6/2004 | Fan et al. | 257/320 |
| 6,864,523 B2 | 3/2005 | Chen | |
| 7,056,647 B2 | 6/2006 | Jung et al. | |
| 7,709,879 B2 | 5/2010 | Van Schaijk et al. | |
| 8,541,827 B2* | 9/2013 | Yaegashi | 257/296 |
| 2002/0027241 A1 | 3/2002 | Sung et al. | |
| 2004/0018687 A1 | 1/2004 | Hsieh et al. | |
| 2008/0121975 A1 | 5/2008 | Hsieh et al. | |

OTHER PUBLICATIONS

Caleb Yu-Sheng Cho, et al. "A Novel Self-Aligned Highly Reliable Sidewall Split-Gate Flash Memory." IEEE Transactions on Electron Devices, vol. 53, No. 3, Mar. 2006. 9 Pages.

* cited by examiner

*Primary Examiner* — Quoc Hoang
(74) *Attorney, Agent, or Firm* — Eschweiler & Associates, LLC

(57) ABSTRACT

Some embodiments of the present disclosure relates to an architecture to create split gate flash memory cell that has lower common source (CS) resistance and a reduced cell size by utilizing isolated source regions that are diffused only in the active regions between the stacked control gate structures. The architecture contains no CS under the isolation region, thus eliminating the effects of CS rounding and CS resistance, resulting in a reduced space between cells in an array. A metal layer is disposed along the semiconductor body above the common source regions to provide potential coupling during programming and erasing and thus electrically connect the common sources of memory cells along a direction that forms a CS line. Hence, this particular architecture reduces the resistance and the metal connection over several cells in an array suppresses the area over head.

20 Claims, 8 Drawing Sheets

US 8,928,060 B2

ARCHITECTURE TO IMPROVE CELL SIZE FOR COMPACT ARRAY OF SPLIT GATE FLASH CELL

CROSS REFERENCE TO RELATED APPLICATIONS

This application is a Non-Provisional application claiming priority to Provisional Patent Application Ser. No. 61/783,295 filed on Mar. 14, 2013 in the name of Yong-Shivan Tsair, et al., entitled "Architecture to Improve Cells Size for Compact Array of Split Gate Flash Cell" and is hereby incorporated by reference.

BACKGROUND

The present disclosure relates to split gate memory cells used in FLASH EEPROMs (Electrically Erasable Programmable Read Only Memories), and in particular, to an architecture to reduce the cell size for compact array of split gate flash memory cell.

Flash cells are used in a wide variety of commercial and military electronic devices and equipment. In flash memory cells, over erase associated with stacked gate structures is eliminated by the use of a split gate structure. However, such structures and the use of dedicated select and erase gate structures adds to the cell size.

DETAILED DESCRIPTION

Figure 1:
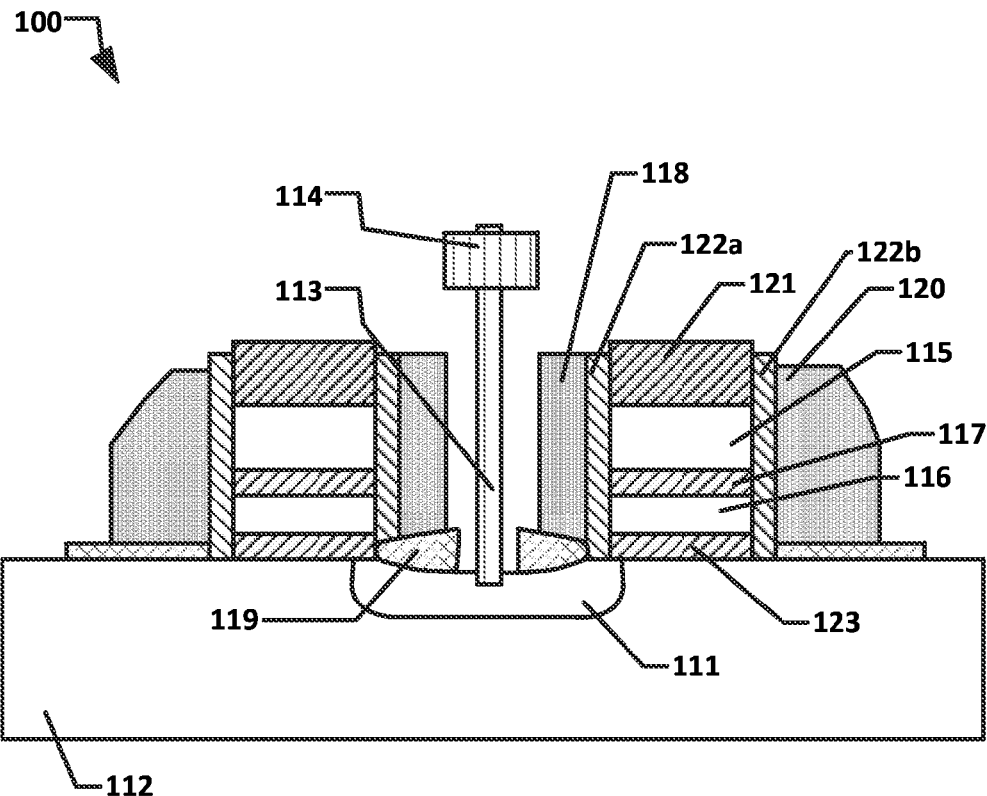
FIG. 1 shows some embodiments of a cross sectional view of a pair of adjacent memory cells of the present disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Split gate memory cells have promising advantages over stacked gate memory cells such as low power consumption, high injection efficiency, less susceptibility to short channel effects, and over erase immunity. The built in select gate transistor in a split gate memory cell can effectively get rid of the on-chip erase procedures that were used in traditional stacked gate cells to resolve over erase problems. Some prior art approaches utilize a common source (CS) diffusion along a single direction in an array connects all the sources in that direction. The cell dimension in a direction of the control gates of two cells that share a common source may be limited by the width of the CS in active region which separates the control gates. Additionally, corner rounding of inner vertices of the CS within these structures can pinch off the channel and increase the channel resistance, which limits downscaling non-volatile memories that include split gate cells.

Accordingly, the present disclosure relates to an architecture to create split gate flash memory cell that has lower CS resistance and a reduced cell size by utilizing isolated source regions that are diffused only in the active regions between the stacked control gate structures. The architecture contains no CS under the isolation region, thus eliminating the effects of CS rounding and CS resistance, resulting in a reduced space between cells in an array. A metal layer is disposed along the semiconductor body above the common source regions to provide potential coupling during programming and erasing and thus electrically connect the common sources of memory cells along a direction that forms a CS line. Hence, this particular architecture reduces the resistance and the metal connection over several cells in an array suppresses the area over head.

FIG. 1 shows some embodiments of a cross sectional view of a first pair of split gate flash memory cells 100 having a first shared common source (CS) region 111 in a semiconductor body 112 and a first contact 113 that connects to the first shared CS region 111. The first contact 113 connects to a conductive layer 114 disposed over the semiconductor body 112 that couples the first contact 113 to a second contact (not shown) of a second pair of split gate flash memory cells (not shown), wherein the second pair of split gate flash memory cells comprise a same architecture as the first pair of split gate flash memory cells 100, having a second shared common source region in the semiconductor body and a second contact that connects to the second shared common source region. As will be demonstrated in subsequent embodiments, the first and second pairs of split gate flash memory cells reside on first and second active regions which are separated by an isolation region for electrical isolation of the first and second active regions. This isolation prevents the corner rounding effects and increased channel resistance observed in some prior art approaches.

The first pair of split gate flash memory cells 100 further comprise a stacked gate structure comprising a control gate 115 over a floating gate 116, and separated by an insulating layer 117. An erase gate 118 resides on a side of the stacked gate structure above a portion of the CS region 111, and isolated from the CS region 111 by a source oxide 119. A select gate 120 resides on an opposite side of the stacked gate structure from the erase gate 118. In some embodiments, the erase gate 118 and the select gate 120 comprise of polysilicon. A hard mask layer 121 resides above the stacked gate structure. A first spacer 122a and a second spacer 122b reside on either side of the stacked gate structure and are configured on electrically isolate the stacked gate structure from the erase gate 118 and the select gate 120, respectively. A floating gate oxide layer 123 isolates the floating gate from a channel region within the semiconductor body 112.

Figure 2A:
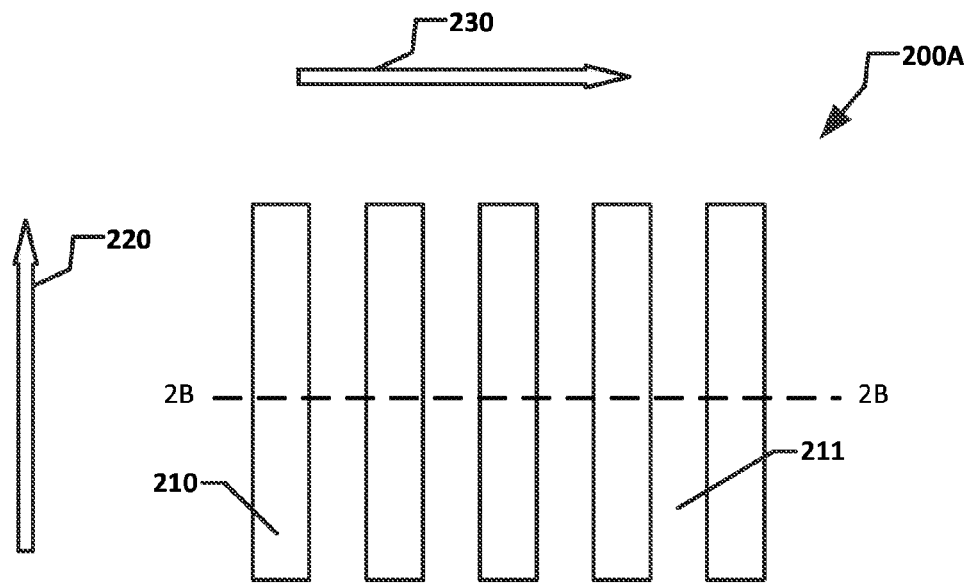
FIG. 2A shows a top view of some embodiments of a semiconductor surface with adjacent isolation regions along a first direction.
Figure 2B:
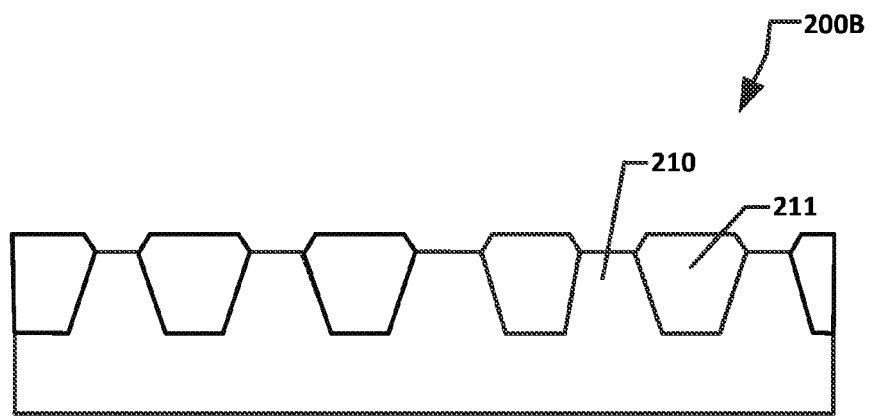
FIG. 2B shows a cross sectional view of the embodiments of FIG. 2A taken along 2B-2B.

FIG. 2A shows a top view of some embodiments of a semiconductor surface 200A with adjacent isolation regions along a first direction. The semiconductor surface 200A has been subjected to active module formation, wherein a plurality of isolation regions are formed on the semiconductor body and are oriented in a first direction 220. FIG. 2B shows a cross sectional view of a semiconductor surface 200B comprising the semiconductor surface 200A along 2B-2B of FIG. 2A. A semiconductor substrate 210 (e.g., a p-type semiconductor substrate) has a plurality of parallel adjacent isolation regions 211. An active region resides between two isolation regions 211. The plurality of isolation regions 211 creates a module that has alternate active and isolation regions. The isolation regions 211 may comprise simple shallow trench isolations (STI) regions, which are preferred over LOCOS (local oxidation of silicon), since they can be formed in smaller dimensions than LOCOS regions. STIs are formed by creating shallow trenches in the semiconductor body and filling it with a dielectric material, to isolate neighboring active regions. The active and isolation regions are disposed parallel to one another in a second direction 230 as shown in the embodiments of FIG. 2A.

Figure 3A:
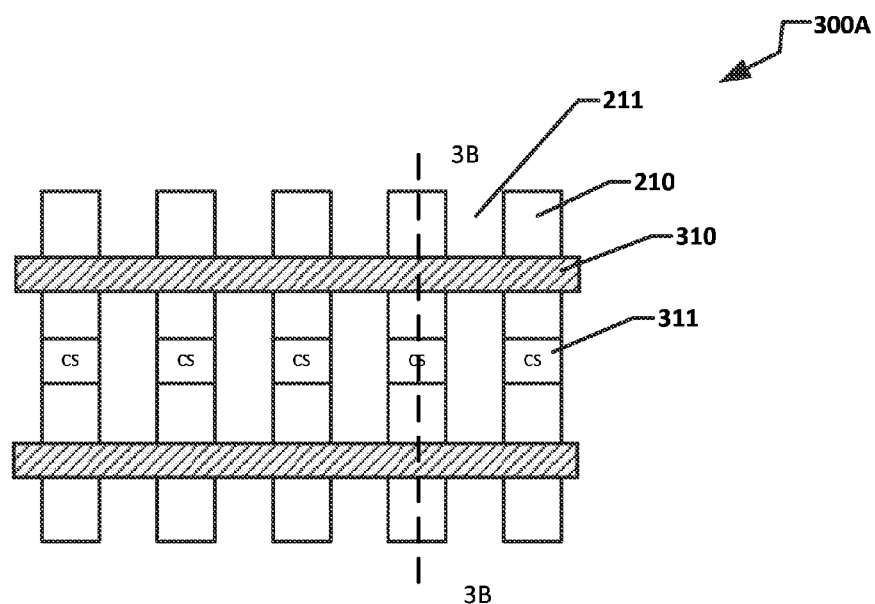
FIG. 3A shows a top view of some embodiments of a semiconductor surface after the formation of stacked gate structures and source diffusion.

FIG. 3A shows a top view of some embodiments of a semiconductor surface 300A after formation of stacked gate structures and source diffusion. A control gate hard mask layer 310 is formed above the semiconductor substrate 210. The source diffusion is carried out in the second direction 230 which is orthogonal to the first direction 220, in such a way that the active regions remain isolated from each other. In other words, the first shared common source and second shared common source are disposed in a direction antiparallel to a direction of alignment of the split gate flash memory cells of each pair. Source dopants comprising n+ ions for a p-type semiconductor substrate 210 are embedded only in common source region 311 between two stacked gate structures which forms a pair of cells for a particular active layer in the first direction 220.

Figure 3B:
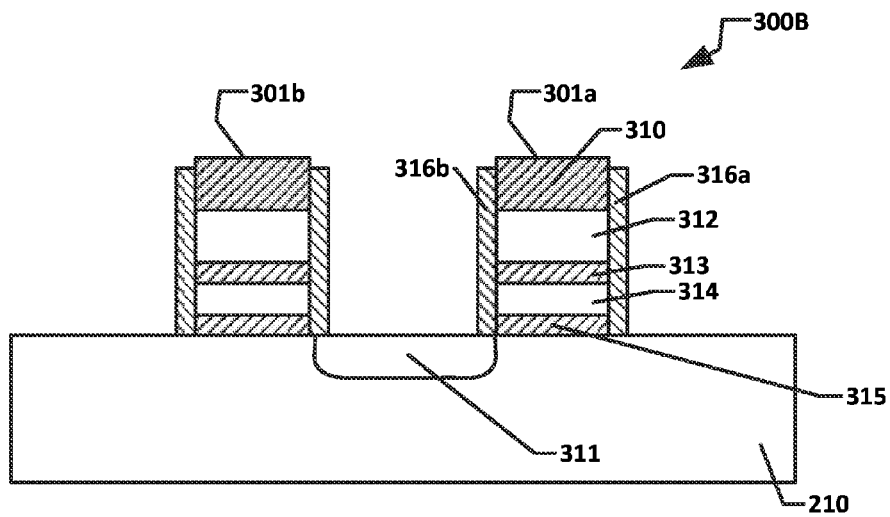
FIG. 3B shows a cross sectional view of a pair of split gate flash memory cells taken along 3B-3B of FIG. 3A.

FIG. 3B shows a cross sectional view of a pair of split gate flash memory cells 300B taken along 3B-3B of FIG. 3A. The pair of split gate flash memory cells 300B comprises a first stacked gate structure 301a and a second stacked gate structure 301b that share a common source region 311 formed on the active region. The first stacked gate structure 301a and the second stacked gate structure 301b are composed of a first oxide layer or floating gate oxide layer 315 disposed on top of the active layer, a floating gate poly layer 314 (e.g., poly silicon) disposed above the floating gate oxide layer 315, an insulating layer 313 (e.g., ONO) configured to insulate the floating gate poly layer 314 from a control gate poly layer 312, and the dielectric hard mask 310 (e.g., dielectric). A first spacer 316a and a second spacer 316b surround the first stacked gate structure 301a and the second stacked gate structure 301b, and are configured to provide insulation from surrounding layers. The fabrication process utilized to form the first and second stacked gate structure 301a, 301b first forms these layers continuously over the semiconductor substrate 210, and are subsequently etched down using an anisotropic etch to create the first and second stacked gate structure 301a, 301b. Some anisotropic etching techniques comprise a wet etchant such as carbon tetrafluoride (CF4), HF, tetramethylammonium hydroxide (TMAH), or combinations of thereof for directional selectivity along different directions within the semiconductor substrate 210. A common source region 311 in formed between the first stacked gate structure 301a and the second stacked gate structure 301b following an ion implantation process.

Figure 3C:
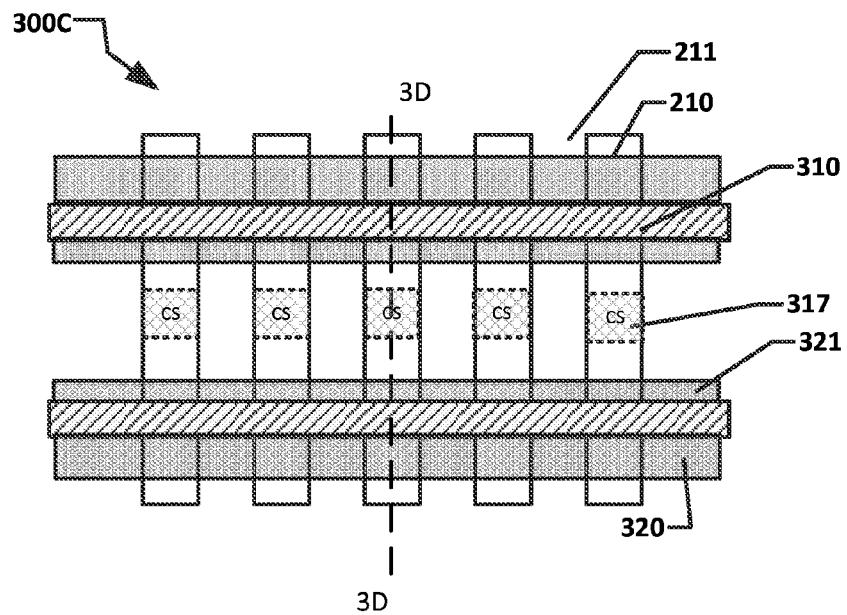
FIG. 3C shows a top view of some embodiments of a semiconductor surface after the deposition and patterning of a poly silicon layer that leads to the formation of select and erase gates.

FIG. 3C shows a top view of some embodiments of a semiconductor surface 300C after the deposition and patterning of a poly silicon layer that leads to the formation of select and erase gates. The semiconductor surface 300C has been subjected to further fabrication steps which comprise formation of a source oxide, wordline (W/L) gate or select gate oxide, select (W/L) gates and erase gates. Multiple oxidation steps are carried out to create select gate oxide and source oxide. A third conductive layer or select gate polysilicon layer is deposited all over the semiconductor body, patterned and etched to form select gates 320 and erase gates 321. The source oxide 317 can be seen on top of the source region.

Figure 3D:
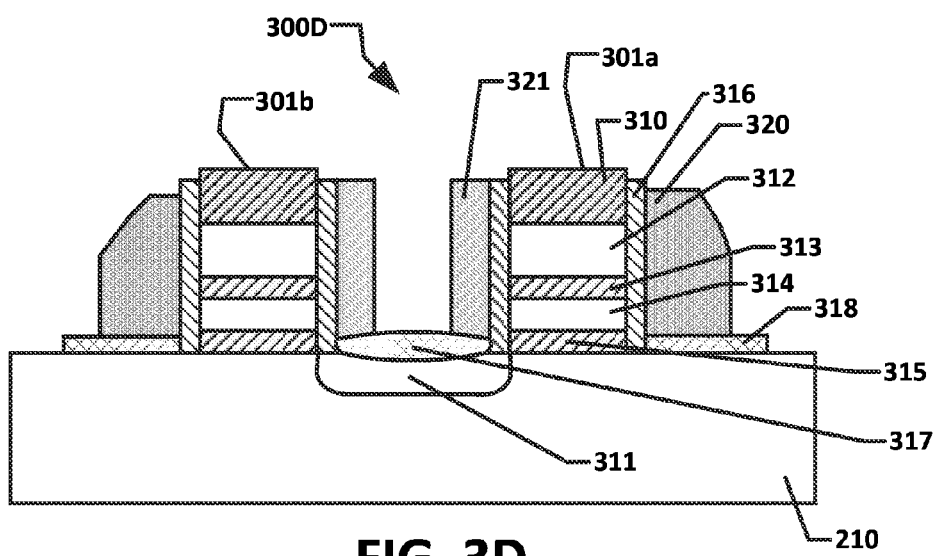
FIG. 3D shows a cross sectional view of the embodiments of FIG. 3C taken along 3D-3D.

FIG. 3D shows a cross sectional view of the embodiments of FIG. 3C taken along 3D-3D, and comprises a pair of split gate flash memory cells 300D. The erase gate 321 and select gate 320 are disposed on either sides of the first stacked gate structure 301a or the second stacked gate structure 301b. The source oxide 317 is disposed above the common source region 311 and below the erase gates 321. The select gates 320 are disposed above a W/L gate oxide layer 318.

Figure 3E:
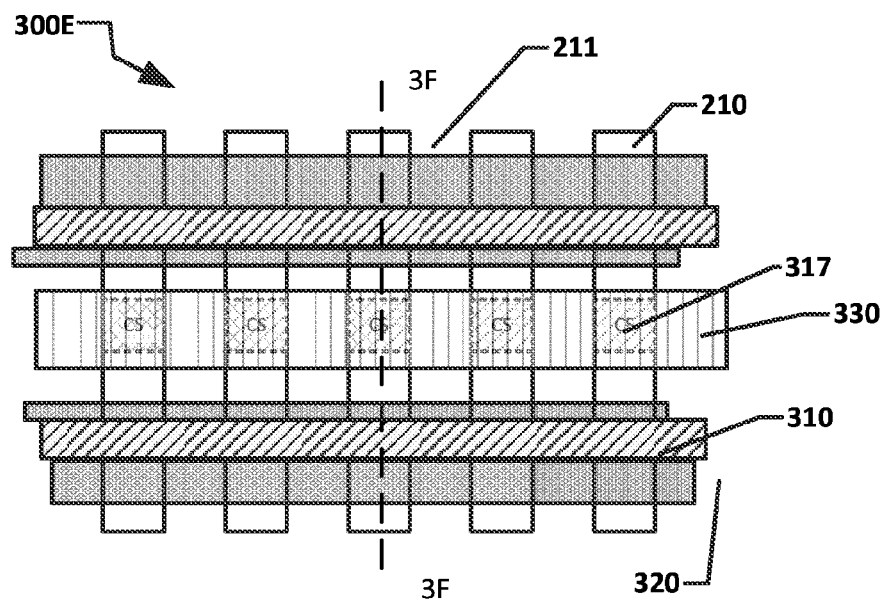
FIG. 3E shows a top view of some embodiments of a semiconductor surface after metallization along the second direction.

FIG. 3E shows a top view of some embodiments of a semiconductor surface 300E. A contact etch process is carried out to create an opening in the source oxide and an ohmic metallization layer 330 has been added to form a metal contact to the source region. The contact layer runs vertically above the semiconductor body and connects all different sources electrically.

In some embodiments, the ohmic metallization layer 330 comprises Ti/Al/Ti or Ti/Al/Ti/TiN, or similar material structure.

Figure 3F:
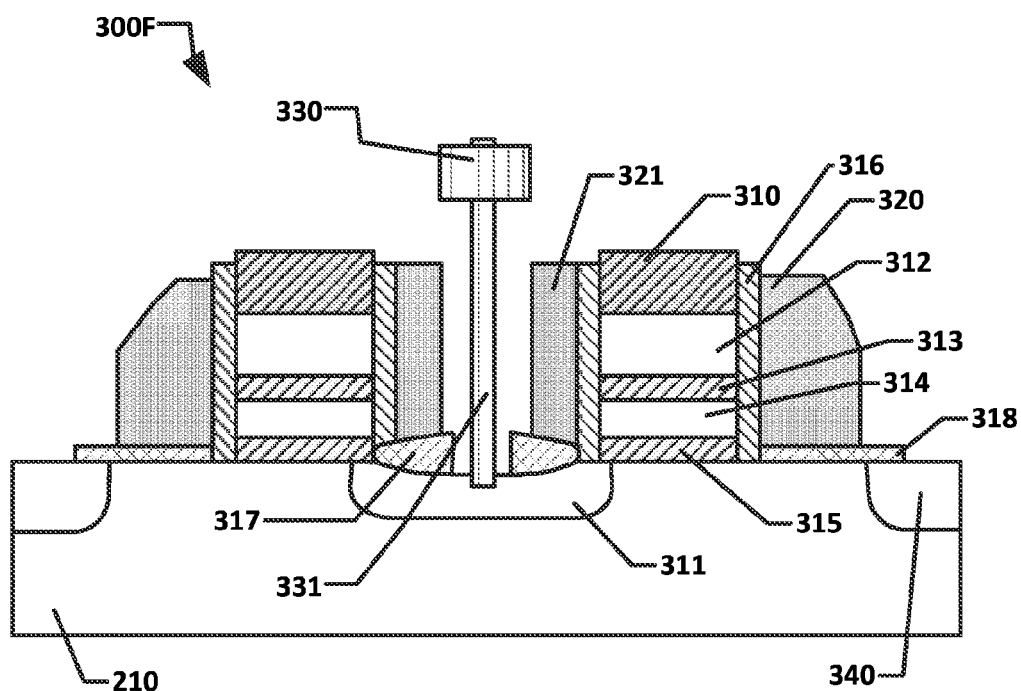
FIG. 3F shows a cross sectional view of the embodiments of FIG. 3E taken along 3F-3F.

FIG. 3F shows a cross sectional view of the embodiments of FIG. 3E taken along 3F-3F, and comprises a pair of split gate flash memory cells 300F. The source oxide 317 is opened after the photolithography process which creates a path for an ohmic contact to the common source region 311. The ohmic metallization layer 330 has a conductive layer that is vertically disposed above the split gate structure and couples to the metal contact layer at other source regions (not shown) and a first contact 331 that extends in to the common source region 311. Subsequently, ionized n+ impurities are implanted into the active layer of the semiconductor substrate 210 to form a lightly-doped-drain (LDD) 340 to create an active channel for the memory cell.

Figure 4:
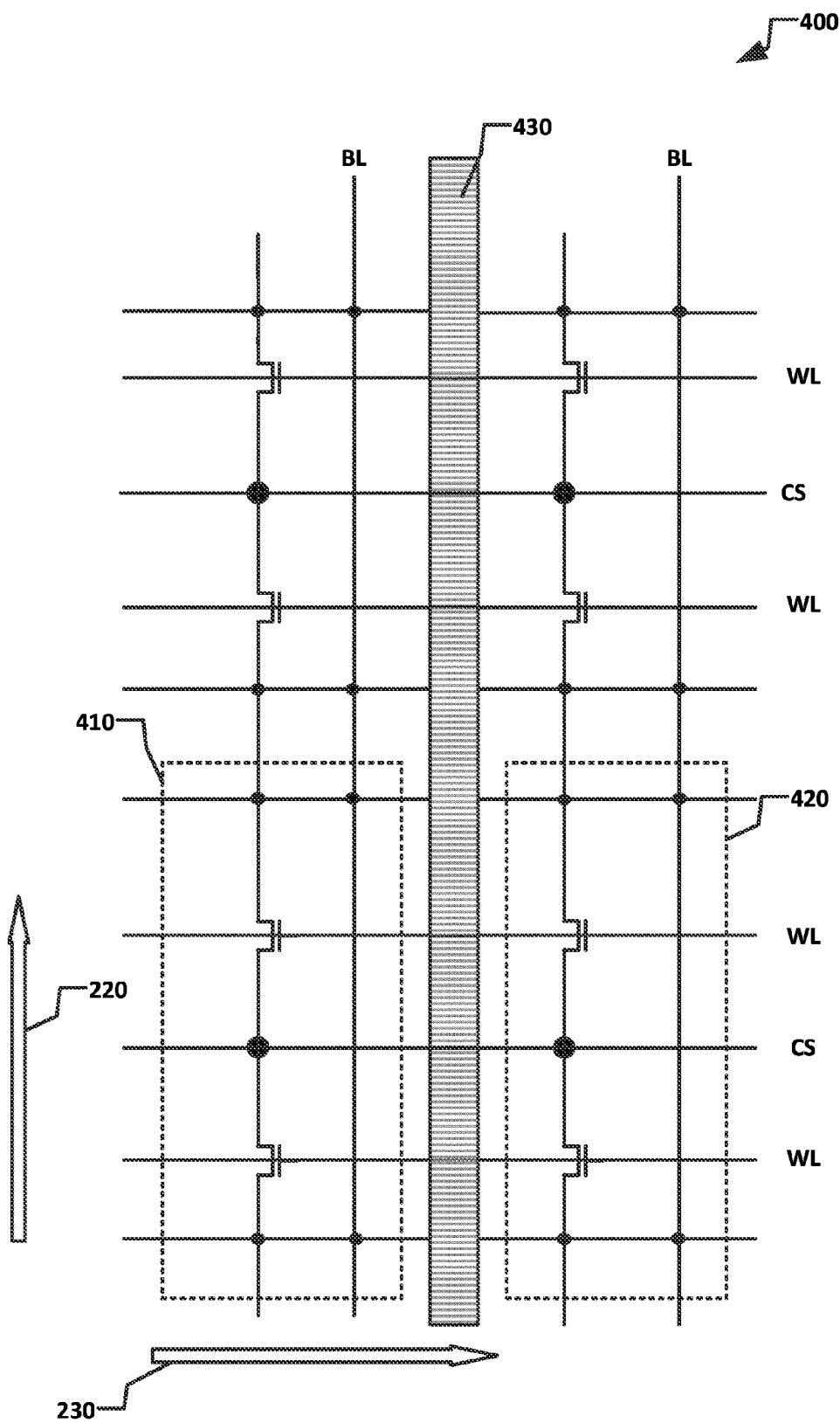
FIG. 4 shows a circuit diagram of some embodiments of a memory array of the embodiments of FIGS. 2A-3F.

FIG. 4 shows a circuit diagram 400 of some embodiments of a memory array of the embodiments of FIGS. 2A-3F. A first pair of split gate flash memory cells 410 share a common source and are oriented in the first direction 220. A second pair of cells 420 also share a common source and are oriented in the first direction 220 and is separated from first pair of split gate flash memory cells 410 by an isolation region 430. The common sources of the pairs 410, 420 are connected through a metal contact layer oriented in the second direction 230 to form a common source (CS) line. The drains of a pair of cells in the first direction are connected to form a bit line (BL). The gates of memory cells along 230 are connected to form a word line (WL). A plurality of such pairs can give rise to an array of memory cells. FIG. 4 represents such an array with 4 pairs of cells. During operation, control circuitry biases the WLs, BLs, and CS lines of the memory array according to predetermined bias conditions to read and write individual data states to the individual cells. Programming is performed by means of source-side channel hot-electron injection. Poly-topoly Fowler-Nordheim (FN) electron tunneling from the floating gate toward the neighboring select gate (W/L) is employed for erasing.

Figure 5:
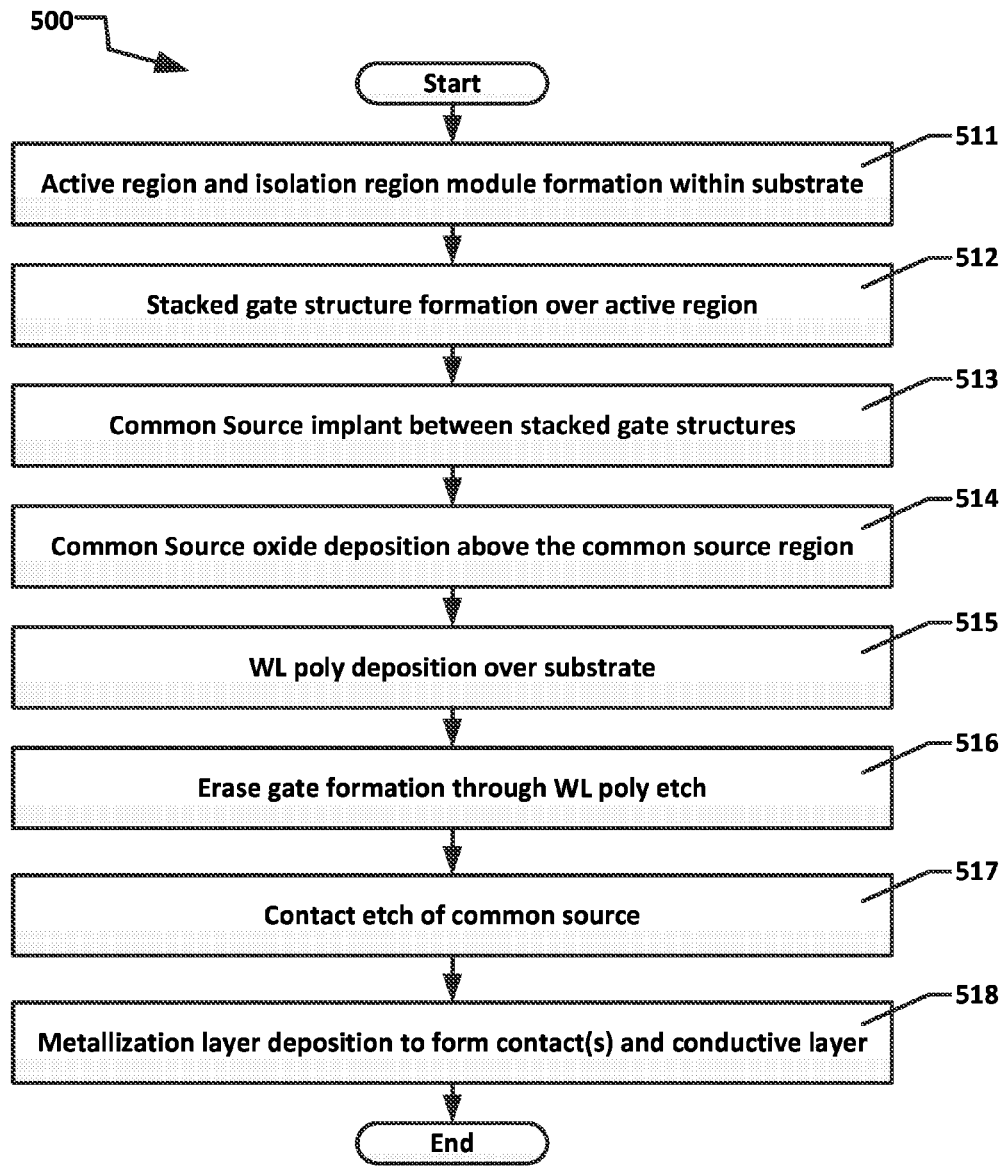
FIG. 5 shows a flow chart of a method according to some embodiments of the present disclosure.

FIG. 5 shows a flow chart of a method 500 according to some embodiments of the present disclosure. The method 500 is performed in accordance with the embodiments of FIGS. 2A-3F. It will be appreciated that in method 500, and subsequently in method 600, some of the steps or blocks may be further subdivided into multiple steps or blocks in some implementations, or may multiple illustrated steps or blocks can be combined in other implementations. Additional un-illustrated steps or blocks may also be present, and/or illustrated steps or blocks may be omitted in some implementations. Also, the order of the steps or blocks may be re-ordered in some embodiments. All such changes are contemplated as falling within the scope of the present disclosure.

At 511 a plurality of isolation regions (e.g., STIs) are disposed on a silicon substrate in an alternately repeating pattern of active and isolation zones in a first direction. In some embodiments, the substrate can be a semiconductor wafer such as a silicon (Si) or silicon-on-insulator (SOI) wafer, a binary compound substrate (e.g., GaAs wafer), a ternary compound substrate (e.g., AlGaAs), or higher order compound wafers, among others. Conventional methods of producing an isolation feature such as STI include forming a hard mask (e.g., silicon nitride, SiN) over a targeted trench layer which includes a thermally grown pad oxide layer, and patterning a photoresist layer over the hard mask to define a trench feature. After patterning, etching is performed through the openings in the hard mask to create recesses in the silicon regions of the silicon substrate. An insulating material, such as oxide or other suitable material, is deposited in the recesses and on the hard mask. A chemical mechanical planarization (CMP) is then performed to remove the insulator material on top of the hard mask and to planarize the top of the STI region. The chemical mechanical planarization stops on the hard mask. Following the planarization, the hard mask layer is removed from the top of the silicon substrate.

At 512 a stacked gate structure that comprises a floating gate and a control gate is formed, following a series of steps. Some of the important steps include, floating gate oxide layer formation, floating gate poly layer deposition, ONO formation, control gate poly layer deposition, control gate hard mask deposition, selective anisotropic etching and spacer formation.

At 513 common source diffusion is performed in such a way that a source region (e.g., n+ ion impurities) is formed in between the stacked gate structures in the active region. The ion implantation to create source regions is carried out only in the openings between two stacked gate structures that form a pair in the first direction, and are separated or isolated within memory cells in the second direction by the isolation regions.

At 514 a common source oxide layer is formed above the common source region. The thickness of the source oxide is more than the W/L gate oxide.

At 515 a W/L poly layer is deposited above the whole wafer surface.

At 516 a photolithographic step that includes an anisotropic etch is carried out to pattern the W/L poly in to select and erase gates, and to etch the poly to create an opening above the source region. A set of erase and select gates are formed for each of the stacked gate structures.

At 517 another lithography step or contact etch follows, which creates openings for the metal contact in the source regions, and creates an opening in the source oxide and provide a path for the ohmic contact to connect with the common source.

At 518 a metal layer is deposited in to the common source through the contact opening.

Figure 6:
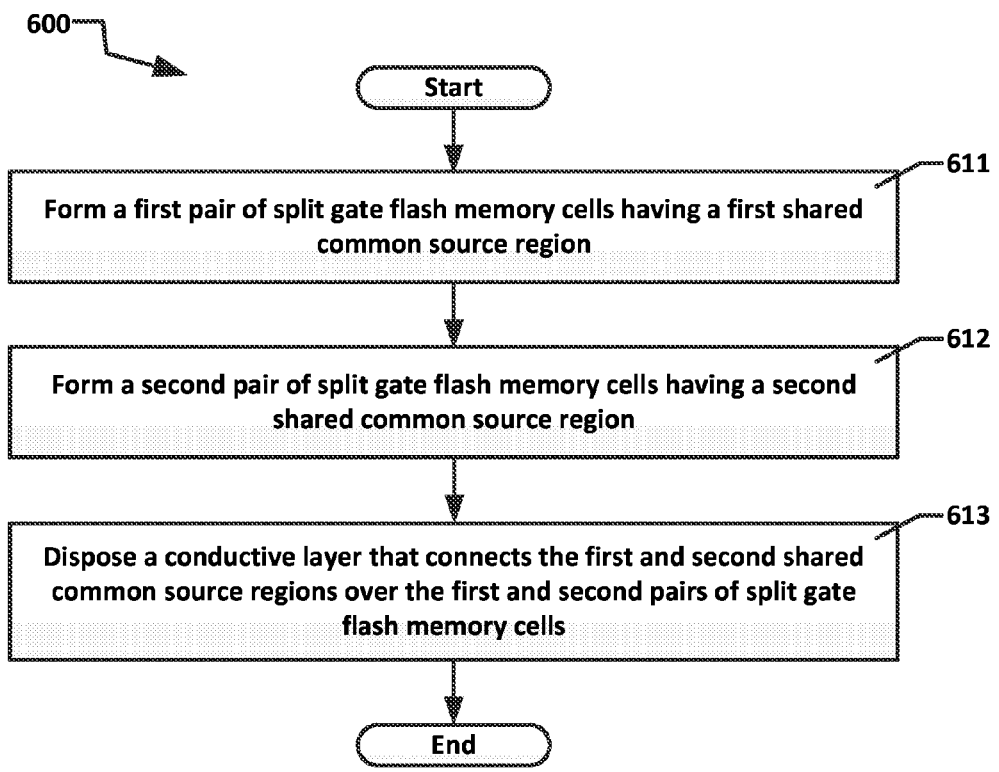
FIG. 6 shows a flow chart of a method according to some embodiments of the present disclosure.

FIG. 6 shows a flow chart of a method 600 performed in accordance with the embodiments of FIGS. 2A-3F.

At 611 a first pair of split gate flash memory cells having a first shared common source region are formed.

At 612 a second pair of split gate flash memory cells having a second shared common source region are formed. In some embodiments, formation of the first and second pairs of split gate flash memory cells includes disposing the first and second pairs of split gate flash memory cells on first and second active regions which are separated by the isolation region, disposing a stacked gate structure comprising a control gate above a floating gate, and surrounding the stacked gate structure with composite spacers. In some embodiments, the first or second shared common source region is formed through ion implantation after the formation of the stacked gate structures, and is diffused in active areas in the semiconductor body, in between the stacked gate structures of each pair of split gate flash memory cells, and not in isolation regions.

At 613 a conductive layer is disposed over the first and second pairs of split gate flash memory cells that connects the first and second shared common source regions. In some embodiments, an etch process is carried out to create an opening to deposit a first contact to the first common source. The first contact comprises a metal layer is deposited into the shared common source regions. The metal layer is disposed along the direction of source implants, thereby creating an electrical connection between all the different sources.

It will also be appreciated that equivalent alterations or modifications may occur to one of ordinary skill in the art based upon a reading or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features or aspects of other implementations as may be desired. Furthermore, to the extent that the terms "includes", "having", "has", "with", or variants thereof are used herein; such terms are intended to be inclusive in meaning—like "comprising." Also, "exemplary" is merely meant to mean an example, rather than the best. It is also to be appreciated that features, layers or elements depicted herein are illustrated with particular dimensions or orientations relative to one another for purposes of simplicity and ease of understanding, and that the actual dimensions or orientations may differ substantially from that illustrated herein.

Therefore, the present disclosure relates to an architecture to create split gate flash memory cell that has lower CS resistance and a reduced cell size by utilizing isolated source regions that are diffused only in the active regions between the stacked control gate structures. The architecture contains no CS under the isolation region, thus eliminating the effects of CS rounding and CS resistance, resulting in a reduced space between cells in an array. A metal layer is disposed along the semiconductor body above the common source regions to provide potential coupling during programming and erasing and thus electrically connect the common sources of memory cells along a direction that forms a CS line. Hence, this particular architecture reduces the resistance and the metal connection over several cells in an array suppresses the area over head.

In some embodiments, the present disclosure relates to a memory device comprising a first pair of split gate flash memory cells, having a first shared common source region in a semiconductor body and a first contact that connects to the first shared common source region, a second pair of split gate flash memory cells having a second shared common source region in the semiconductor body and a second contact that connects to the second shared common source region, and a conductive layer disposed over the semiconductor body that couples the first contact to the second contact of the split gate flash memory cells.

In some embodiments, the present disclosure relates to a memory device comprising a first pair of split gate flash memory cell, having a first shared common source region in a semiconductor body, which is electrically isolated from a second a second pair of split gate flash memory cells, having a second shared common source, by an isolation region, wherein the first shared common source and the second shared common source are embedded in first and second active regions of a semiconductor body that are separated by the isolation region.

In some embodiments, the present disclosure relates to a method of forming a memory device comprising forming a first pair of split gate flash memory cells, having a first shared common source region, forming a second pair of split gate flash memory cells having a second shared common source region, and disposing a conductive layer over the first and second pairs of split gate flash memory cells that connects the first and second shared common source regions.

What is claimed is:

1. A memory device comprising:
   a first pair of split gate flash memory cells disposed over a semiconductor body, and respectively comprising a stacked gate laterally separated in a first direction from an erase gate by a spacer,
   a first shared common source region disposed in the semiconductor body at a first location between the stacked gates of the first pair of split gate flash memory cells, wherein the erase gates of the first pair of split gate flash memory cells comprise separate erase gates disposed over opposing sides of the first shared common source region; and
   a first contact vertically extending between the erase gates of the first pair of split gate flash memory cells to the first shared common source region;
   a second pair of split gate flash memory cells disposed apart from the first pair of split gate flash memory cells in a second direction perpendicular to the first direction, and respectively comprising a stacked gate laterally separated in the first direction from an erase gate by a spacer;
   a second shared common source region disposed in the semiconductor body at a second location between the stacked gates of the second pair of split gate flash memory cells, wherein the erase gates of the second pair of split gate flash memory cells comprise separate erase gates disposed over opposing sides of the second shared common source;
   a second contact vertically extending between the erase gates of the second pair of split gate flash memory cells to the second shared common source region; and
   a conductive layer disposed over the semiconductor body that couples the first contact to the second contact of the split gate flash memory cells.

2. The device of claim 1, wherein the first and second pairs of split gate flash memory cells reside on first and second active regions which are separated by an isolation region.

3. The device of claim 1, wherein the split gate flash memory cells each comprise:
   a stacked gate structure comprising a control gate over a floating gate;
   an erase gate on a side of the stacked gate structure above a portion of the common source region; and
   a select gate on an opposite side of the stacked gate structure from the erase gate.

4. The device of claim 3, wherein the erase gate and the select gate comprise of polysilicon.

5. The device of claim 1, wherein the conductive layer comprises metallization layer.

6. A memory device comprising:
   a first pair of split gate flash memory cells, comprising:
      a first erase gate disposed on a first side of a first stacked gate;
      a second erase gate disposed on a second side of a second stacked gate, wherein the second erase gate is separated from the first erase gate in a first direction;
      a first shared common source region disposed in a semiconductor body at a position under the first and second erase gates,
      a first contact vertically extending between the first and second erase gates to the first shared common source region.

7. The device of claim 6, wherein the first pair of split gate flash memory cells is electrically isolated from a second pair of split gate flash memory cells by an isolation region in a second direction that is different from the first direction, the second pair of split gate flash memory cells having a second shared common source disposed under separated erase gates at an opposing side of respective stacked gates of the second pair of split gate flash memory cells.

8. The device of claim 7, wherein the first shared common source and the second shared common source are embedded in first and second active regions of the semiconductor body that are separated by the isolation region.

9. The device of claim 8, wherein the first shared common source and second shared common source are disposed in a direction antiparallel to a direction of alignment of the split gate flash memory cells of each pair.

10. The device of claim 8, wherein a contact layer runs vertically above the semiconductor body to connect the first and second shared sources in a direction anti parallel to a direction of alignment of the split gate flash memory cells of each pair.

11. The device of claim 10, wherein the contact layer comprises:
    the first contact, that extends in to the first shared common source region through an opening in a source oxide layer;
    a conductive layer that is vertically disposed above the first contact; that connects the first contact of the first pair of split gate flash memory cell to a second contact of the second pair of split gate flash memory cells.

12. The device of claim 8, wherein a source oxide layer is disposed above the first and second shared common sources.

13. A method of forming a memory device formed in a semiconductor body, comprising:
    forming a first pair of split gate flash memory cells, each comprising: a stacked gate and an erase gate disposed in lateral along a first direction over a semiconductor body separated by a spacer, wherein the erase gates of the first pair of split gate flash memory cells are disposed at an opposing side of the stacked gate;
    forming a first shared common source region disposed between the stacked gates and under the erase gates of the first pair of split gate flash memory cells in the semiconductor body;

forming a first contact disposed between the erase gates that connects to the first shared common source region;

forming a second pair of split gate flash memory cells apart from the first pair of split gate flash memory cells cross the first direction, each comprising: a stacked gate and an erase gate disposed in lateral along the first direction over the semiconductor body separated by a spacer, wherein the erase gates of the second pair of split gate flash memory cells are disposed at an opposing side of the stacked gates;

forming a second shared common source region disposed between the stacked gates and under the erase gates of the first pair of split gate flash memory cells in the semiconductor body;

forming a second contact disposed between the erase gates that connects to the second shared common source region; and disposing a conductive layer over the first and second pairs of split gate flash memory cells that connects the first and second contacts.

14. The method of claim 13, further comprising:

disposing the first and second pairs of split gate flash memory cells on first and second active regions which are separated by an isolation region; and disposing a stacked gate structure comprising a control gate disposed over a floating gate, and wherein the stacked gate structure is surrounded by composite spacers.

15. The method of claim 14, wherein the first or second shared common source region is formed through ion implantation after the formation of the stacked gate structures.

16. The method of claim 14, wherein the first or second shared common source region is diffused in active areas in the semiconductor body, in between the stacked gate structures of each pair of split gate flash memory cells, and not in isolation regions.

17. The method of claim 13, wherein erase gates are formed after patterning and etching of a select gate polysilicon layer above the shared common source regions.

18. The method of claim 13, wherein an etch process is carried out to create an opening for forming the first contact to the first shared common source region or the second contact to the second shared common source region.

19. The method of claim 13, wherein a metal layer is deposited into the shared first and second common source regions.

20. The method of claim 19, further comprising disposing the metal layer along a direction of source implants, and creating an electrical connection between the first shared common source and the second shared common source.

* * * * *